(12) United States Patent
Wakioka et al.

(10) Patent No.: US 11,101,052 B2
(45) Date of Patent: Aug. 24, 2021

(54) CONDUCTIVE MATERIAL, CONNECTION STRUCTURE AND METHOD FOR PRODUCING CONNECTION STRUCTURE

(71) Applicant: SEKISUI CHEMICAL CO., LTD., Osaka (JP)

(72) Inventors: Sayaka Wakioka, Osaka (JP); Hidefumi Yasui, Kouka (JP); Shuujirou Sadanaga, Kouka (JP); Masahiro Itou, Osaka (JP); Shike Sou, Osaka (JP); Yuta Yamanaka, Kouka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/331,965

(22) PCT Filed: Sep. 21, 2017

(86) PCT No.: PCT/JP2017/034027
§ 371 (c)(1),
(2) Date: Mar. 9, 2019

(87) PCT Pub. No.: WO2018/066368
PCT Pub. Date: Apr. 12, 2018

(65) Prior Publication Data
US 2019/0252089 A1      Aug. 15, 2019

(30) Foreign Application Priority Data

Oct. 6, 2016   (JP) .............................. JP2016-198080

(51) Int. Cl.
*H01B 1/22*   (2006.01)
*H01B 1/00*   (2006.01)
(Continued)

(52) U.S. Cl.
CPC ................ *H01B 1/22* (2013.01); *C08K 3/10* (2013.01); *C08K 5/09* (2013.01); *C08K 5/49* (2013.01);
(Continued)

(58) Field of Classification Search
CPC ............... H01B 1/22; C08K 5/52; C08K 3/08
(Continued)

(56) References Cited

U.S. PATENT DOCUMENTS

2007/0001313 A1   1/2007   Fujimoto et al.
2010/0059872 A1   3/2010   Katsurayama
(Continued)

FOREIGN PATENT DOCUMENTS

CN   102127375 A   7/2011
CN   102432835 A   5/2012
(Continued)

OTHER PUBLICATIONS

Written Opinion of the International Searching Authority (PCT/ISA/237) for Application No. PCT/JP2017/034027 dated Dec. 5, 2017 (English Translation mailed Apr. 18, 2019).
(Continued)

*Primary Examiner* — Khanh T Nguyen
(74) *Attorney, Agent, or Firm* — Cheng Law Group, PLLC

(57) ABSTRACT

There is provided a conductive material in which, even when a conductive material is left for a certain period of time, solder of conductive particles can be efficiently placed on an electrode, and, in addition, even if an electrode width and an inter-electrode width are narrow, occurrence of migration can be effectively suppressed, and generation of voids can be effectively suppressed. The conductive material according to the present invention contains a plurality of conductive particles in which an outer surface portion of a conductive (Continued)

portion comprises solder, a thermosetting compound, an acid anhydride thermosetting agent, and an organophosphorus compound.

11 Claims, 3 Drawing Sheets

(51) Int. Cl.
| | |
|---|---|
| *H01R 11/01* | (2006.01) |
| *C08K 5/09* | (2006.01) |
| *C08K 5/49* | (2006.01) |
| *H01B 5/16* | (2006.01) |
| *C08L 101/00* | (2006.01) |
| *C08K 3/10* | (2018.01) |
| *C08K 3/11* | (2018.01) |
| *C08L 63/00* | (2006.01) |

(52) U.S. Cl.
CPC .............. *C08L 101/00* (2013.01); *H01B 1/00* (2013.01); *H01B 5/16* (2013.01); *H01R 11/01* (2013.01); *C08K 3/11* (2018.01); *C08L 63/00* (2013.01)

(58) Field of Classification Search
USPC .......................................... 174/257; 257/788
See application file for complete search history.

(56) References Cited

U.S. PATENT DOCUMENTS

| | | |
|---|---|---|
| 2010/0084757 A1 | 4/2010 | Hariharan et al. |
| 2010/0243303 A1 | 9/2010 | Arifuku et al. |
| 2011/0315916 A1 | 12/2011 | Wilson et al. |
| 2013/0075142 A1 | 3/2013 | Izawa et al. |
| 2013/0146342 A1* | 6/2013 | Eom ........................ H01B 1/22 174/257 |
| 2013/0241086 A1* | 9/2013 | Sakane .................... C08K 5/52 257/788 |
| 2014/0153167 A1 | 6/2014 | Hariharan et al. |
| 2014/0183715 A1 | 7/2014 | Kanamori et al. |
| 2015/0008022 A1 | 1/2015 | Masui et al. |
| 2016/0194525 A1 | 7/2016 | Mizowaki et al. |
| 2016/0194526 A1 | 7/2016 | Mizowaki et al. |
| 2016/0251495 A1 | 9/2016 | Hariharan et al. |

FOREIGN PATENT DOCUMENTS

| | | | | |
|---|---|---|---|---|
| CN | 102513736 A | 6/2012 | | |
| CN | 102791820 A | 11/2012 | | |
| CN | 105209515 A | 12/2015 | | |
| CN | 105452414 A | 3/2016 | | |
| CN | 105493201 A | * 4/2016 | .............. | C08K 3/08 |
| JP | 2004-260131 A | 9/2004 | | |
| JP | 2012-504179 A | 2/2012 | | |
| JP | 2012-72383 A | 4/2012 | | |
| JP | 2012-142271 A | 7/2012 | | |
| JP | 2013-131464 A | 7/2013 | | |
| JP | 2015-98588 A | 5/2015 | | |
| JP | 2016-124905 A | 7/2016 | | |
| WO | WO-2008/023452 A1 | 2/2008 | | |
| WO | WO-2012/165416 A1 | 12/2012 | | |
| WO | WO-2013/115360 A1 | 8/2013 | | |
| WO | WO-2013/125517 A1 | 8/2013 | | |
| WO | WO-2016/104275 A1 | 6/2016 | | |
| WO | WO-2017/033935 A1 | 3/2017 | | |

OTHER PUBLICATIONS

International Search Report for the Application No. PCT/JP2017/034027 dated Dec. 5, 2017.
Written Opinion of the International Searching Authority (PCT/ISA/237) for Application No. PCT/JP2017/034027 dated Dec. 5, 2017.
The First Office Action for the Application No. 201780034698.0 from The State Intellectual Property Office of the People's Republic of China dated Apr. 23, 2020.
The Second Office Action for the Application No. 201780034698.0 from The State Intellectual Property Office of the People's Republic of China dated Jan. 8, 2021.
Notification of Reasons for Refusal for the Application No. 2017-550783 from Japan Patent Office dated Jul. 6, 2021.

\* cited by examiner

[FIG. 1]
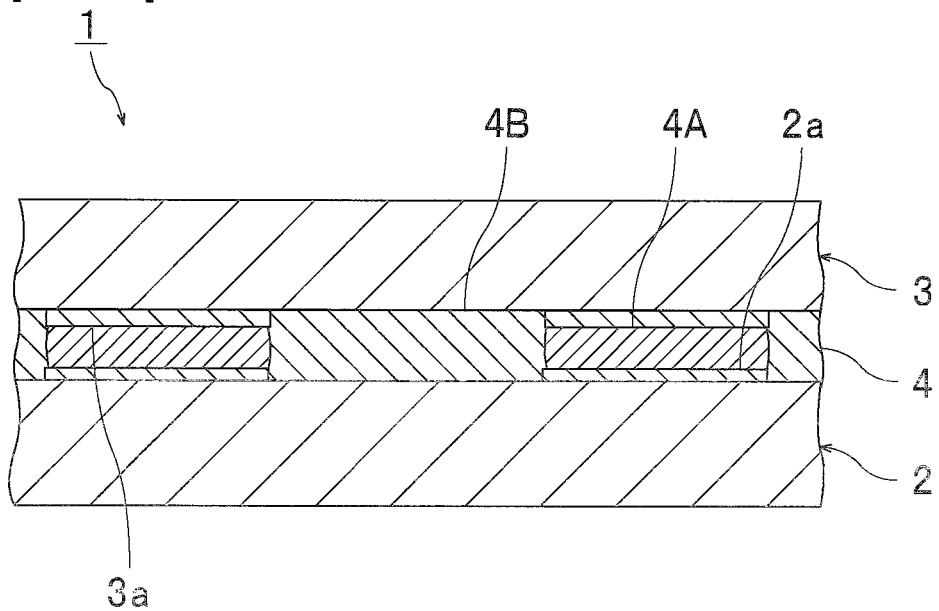

[FIG. 2]
(a)
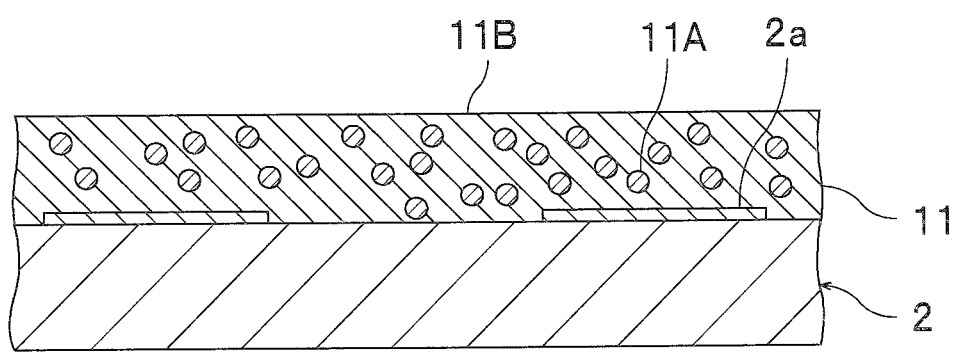
(b)
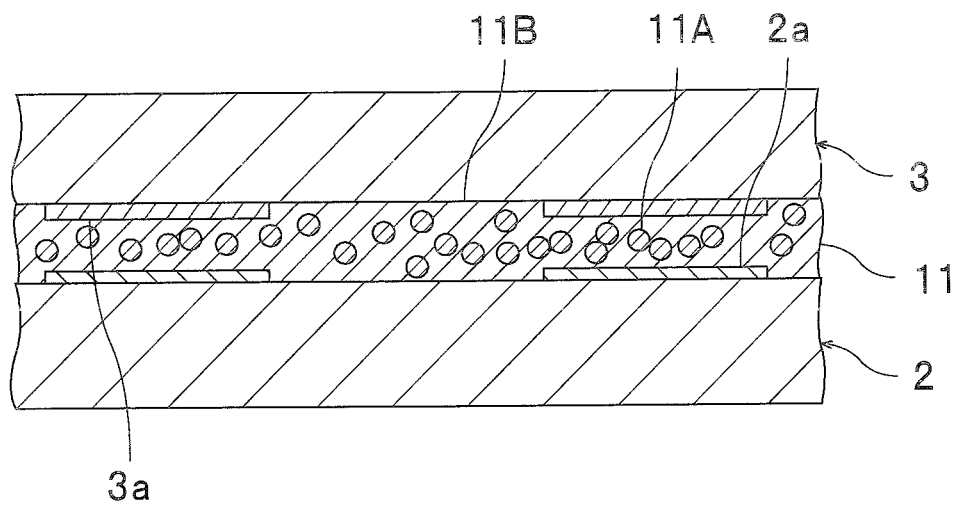
(c)
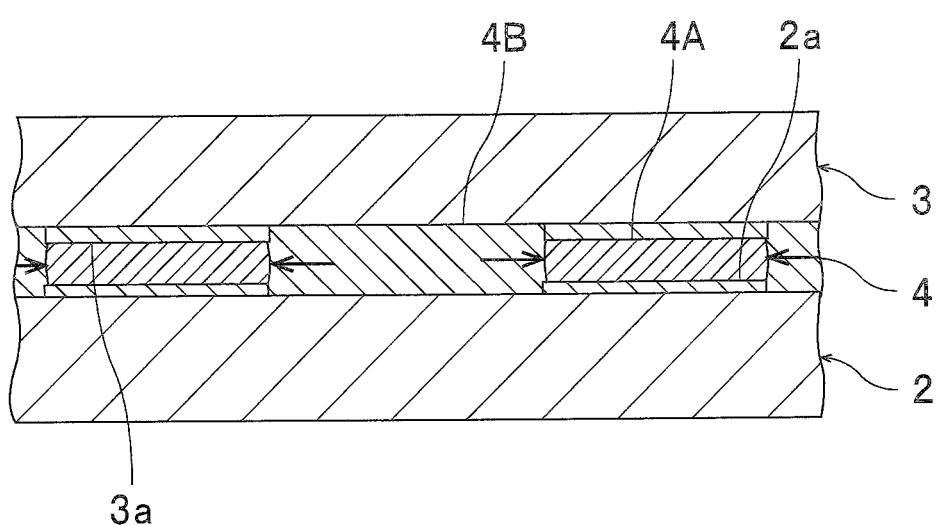

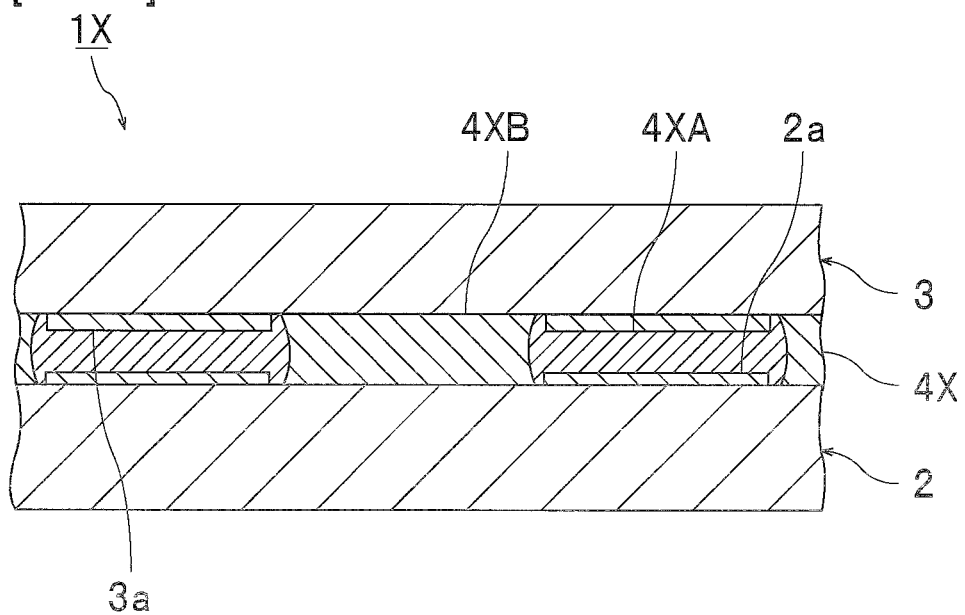
[FIG. 3]

CONDUCTIVE MATERIAL, CONNECTION STRUCTURE AND METHOD FOR PRODUCING CONNECTION STRUCTURE

TECHNICAL FIELD

The present invention relates to a conductive material containing a plurality of conductive particles in which an outer surface portion of a conductive portion is made of solder. The present invention also relates to a connection structure using the conductive material and a method for producing a connection structure.

BACKGROUND ART

Anisotropic conductive materials such as anisotropic conductive paste and anisotropic conductive films are widely known. In the anisotropic conductive material, conductive particles are dispersed in a binder resin.

The anisotropic conductive material is used to obtain various connection structures. Examples of connection using the anisotropic conductive material include a connection between a flexible printed board and a glass substrate (FOG (Film on Glass)), a connection between a semiconductor chip and a flexible printed board (COF (Chip on Film)), a connection between a semiconductor chip and a glass substrate (COG (Chip on Glass)), and a connection between a flexible printed board and a glass epoxy board (FOB (Film on Board)).

For example, when an electrode of a flexible printed board and an electrode of a glass epoxy board are electrically connected by the anisotropic conductive material, the anisotropic conductive material containing conductive particles is placed on the glass epoxy board. Then, the flexible printed board is stacked to be heated and pressurized. Thereby, the anisotropic conductive material is cured to electrically connect the electrodes via the conductive particles, and thus to obtain the connection structure.

As an example of the anisotropic conductive material, the following Patent Document 1 describes an anisotropic conductive material containing conductive particles and a resin component which is not completely cured at the melting point of the conductive particles. Specific examples of the conductive particles include metals such as tin (Sn), indium (In), bismuth (Bi), silver (Ag), copper (Cu), zinc (Zn), lead (Pb), cadmium (Cd), gallium (Ga) and thallium (Tl), and alloys of these metals.

Patent Document 1 describes that electrodes are electrically connected through a resin heating step in which an anisotropic conductive resin is heated to a temperature which is higher than the melting point of the conductive particles and at which the resin component is not completely cured, and a resin component curing step in which the resin component is cured. In addition, Patent Document 1 describes that mounting is performed according to the temperature profile shown in FIG. 8. In Patent Document 1, the conductive particles are melted in the resin component, which is not completely cured, at a temperature at which the anisotropic conductive resin is heated.

The following Patent Document 2 discloses an adhesive tape including a resin layer containing a thermosetting resin, a solder powder, and a curing agent, and in this adhesive tape, the solder powder and the curing agent reside in the resin layer. This adhesive tape is in the form of a film and is not pasty.

In addition, Patent Document 2 discloses a method of bonding using the adhesive tape. Specifically, a first substrate, an adhesive tape, a second substrate, an adhesive tape and a third substrate are stacked in this order as viewed from the bottom to obtain a stack. In this case, a first electrode provided to the surface of the first substrate and a second electrode provided to the surface of the second substrate are opposed to each other. Also a second electrode provided to the surface of the second substrate and a third electrode provided to the surface of the third substrate are opposed to each other. The stack is then bonded under heating at a predetermined temperature. Thereby, a connection structure is obtained.

The following Patent Document 3 discloses a curable epoxy resin composition containing an epoxy compound, an acid anhydride type curing agent, and a quaternary phosphonium salt type curing accelerator. The curable epoxy resin composition contains, as the epoxy compound, 30% by weight to 90% by weight of a bisphenol A type epoxy resin and 10% by weight to 70% by weight of an alicyclic epoxy compound with respect to the total amount (100% by weight) of the epoxy compound. The acid anhydride type curing agent is a nonaromatic acid anhydride type curing agent. Patent Document 3 describes neither that conductive particles are contained, nor that a curable epoxy resin composition is used as a conductive material.

The following Patent Document 4 discloses a conductive material containing conductive particles in which a group including a carboxyl group is covalently bonded to the surface of a solder via an ether bond or an ester bond, and a binder resin. Although this conductive material can decrease the connection resistance and suppress generation of voids in a connection structure when the connection structure is obtained by electrically connecting electrodes, a complex process is required for production of the conductive particles.

RELATED ART DOCUMENTS

Patent Documents

Patent Document 1: JP 2004-260131 A
Patent Document 2: WO 2008/023452 A1
Patent Document 3: JP 2016-124905 A
Patent Document 4: WO 2013/125517 A1

SUMMARY OF THE INVENTION

Problems to be Solved by the Invention

In conventional solder particles and conductive materials containing conductive particles each having a solder layer at a surface, the moving speed to the electrode (line) of the solder particles or the conductive particles may be slow. In particular, when the conductive material is placed on a substrate or the like and then left for a long time, the solder may hardly aggregate on the electrode in some cases. As a result, conduction reliability between electrodes tends to be low.

When an electrode width and an inter-electrode width are narrow, if solder is to be selectively placed on the electrode, the solder tends to remain in a region (space) in which no electrode is formed, and migration may occur. As a result, insulation reliability between electrodes tends to be low.

In conventional solder particles and conductive materials containing conductive particles each having a solder layer at a surface, voids tend to be generated, and in order to suppress the voids, it is necessary to perform surface treatment or the like on the conductive particles, and a complex process is required for production of the conductive particles.

It is an object of the present invention to provide a conductive material in which, even when a conductive material is left for a certain period of time, solder of conductive particles can be efficiently placed on an electrode, and, in addition, even if an electrode width and an inter-electrode width are narrow, occurrence of migration can be effectively suppressed, and generation of voids can be effectively suppressed. It is also an object of the present invention to provide a connection structure using the conductive material and a method for producing a connection structure.

Means for Solving the Problems

According to a broad aspect of the present invention, there is provided a conductive material containing a plurality of conductive particles in which an outer surface portion of a conductive portion comprises solder, a thermosetting compound, an acid anhydride thermosetting agent, and an organophosphorus compound.

In a specific aspect of the conductive material according to the present invention, the organophosphorus compound is an organophosphonium salt, an organophosphorus acid, an organophosphorus acid ester, an organophosphonic acid, an organophosphonic acid ester, an organophosphinic acid, or an organophosphinic acid ester.

In a specific aspect of the conductive material according to the present invention, the melting point of the organophosphorus compound is 170° C. or less.

In a specific aspect of the conductive material according to the present invention, the organophosphorus compound is in a liquid state at 25° C.

In a specific aspect of the conductive material according to the present invention, the acid anhydride thermosetting agent is a solid at 25° C.

In a specific aspect of the conductive material according to the present invention, the content of the organophosphorus compound is 0.5 parts by weight or more and 10 parts by weight or less with respect to 100 parts by weight of the acid anhydride thermosetting agent.

In a specific aspect of the conductive material according to the present invention, the content of the acid anhydride thermosetting agent in 100% by weight of the conductive material is 5% by weight or more and 50% by weight or less.

In a specific aspect of the conductive material according to the present invention, the conductive material is a conductive paste.

According to a broad aspect of the present invention, there is provided a connection structure including a first connection object member having at least one first electrode on its surface, a second connection object member having at least one second electrode on its surface, and a connection portion connecting the first connection object member and the second connection object member. In this connection structure, the connection portion is formed of the above-described conductive material, and the first electrode and the second electrode are electrically connected by a solder portion in the connection portion.

In a specific aspect of the connection structure according to the present invention, when viewing a portion where the first electrode and the second electrode face each other in a stacking direction of the first electrode, the connection portion, and the second electrode, the solder portion in the connection portion is placed in 50% or more of 100% of the area of the portion where the first electrode and the second electrode face each other.

According to a broad aspect of the present invention, there is provided a method for producing a connection structure, including a process of placing the above-described conductive material on a surface of a first connection object member, having at least one first electrode on its surface, with the use of the conductive material, a process of disposing a second connection object member, having at least one second electrode on its surface, on a surface opposite to the first connection object member side of the conductive material such that the first electrode and the second electrode face each other, and a process of heating the conductive material to a temperature not less than a melting point of solder of the conductive particles to form a connection portion, connecting the first connection object member and the second connection object member, with the conductive material and electrically connecting the first electrode and the second electrode via a solder portion in the connection portion.

In a specific aspect of the method for producing a connection structure according to the present invention, when viewing a portion where the first electrode and the second electrode face each other in a stacking direction of the first electrode, the connection portion, and the second electrode, the solder portion in the connection portion is placed in 50% or more of 100% of the area of the portion where the first electrode and the second electrode face each other.

Effect of the Invention

The conductive material according to the present invention contains the plurality of conductive particles in which the outer surface portion of the conductive portion is made of solder, the thermosetting compound, the acid anhydride thermosetting agent, and the organophosphorus compound. In the conductive material according to the present invention, since the above configuration is provided, even when the conductive material is left for a certain period of time, solder of the conductive particles can be efficiently placed on the electrode, and, in addition, even if the electrode width and the inter-electrode width are narrow, occurrence of migration can be effectively suppressed, and generation of voids can be effectively suppressed.

BRIEF DESCRIPTION OF DRAWINGS

FIG. 1 is a cross-sectional view schematically showing a connection structure obtained using a conductive material according to one embodiment of the present invention.

FIGS. 2(a) to 2(c) are cross-sectional views for explaining respective processes of an example of a method for producing a connection structure using the conductive material according to one embodiment of the present invention.

FIG. 3 is a cross-sectional view showing a modified example of the connection structure.

MODE(S) FOR CARRYING OUT THE INVENTION

Hereinafter, the details of the present invention will be described.

(Conductive Material)

The conductive material according to the present invention contains a plurality of conductive particles in which an outer surface portion of a conductive portion is made of solder, a thermosetting compound, an acid anhydride thermosetting agent, and an organophosphorus compound. The solder is contained in the conductive portion and is a portion or the whole of the conductive portion.

In the present invention, since the above configuration is provided, even when the conductive material is left for a certain period of time, solder of the conductive particles can be efficiently placed on the electrode, and, in addition, even if the electrode width and the inter-electrode width are narrow, occurrence of migration can be effectively suppressed. For example, even when the conductive material is left on the connection object member for a certain period of time after the conductive material is placed on the connection object member such as a substrate, the solder of the conductive particles can be efficiently placed on the electrode.

At the time of producing the connection structure, after the conductive material is placed by screen printing or the like, the conductive material may be left for a certain period of time before the conductive material is electrically connected. In a conventional conductive material, for example, when the conductive material is left for a certain period of time after the conductive material is placed, conductive particles cannot be efficiently placed on the electrode, so that conduction reliability between the electrodes is reduced. In the present invention, since the above configuration is adopted, even when the conductive material is left for a certain period of time after the conductive material is placed, the conductive particles can be efficiently placed on the electrode, so that the conduction reliability between the electrodes can be sufficiently enhanced.

Further, in the present invention, since the above configuration is provided, when the electrodes are electrically connected, the plurality of conductive particles are likely to gather between the upper and lower opposed electrodes, and the plurality of conductive particles can be efficiently placed on the electrode (line). In addition, such a phenomenon that a portion of the plurality of conductive particles is placed in a region (space) where no electrode is formed is suppressed, and the amount of the conductive particles placed in the region where no electrode is formed can be considerably reduced. Accordingly, the conduction reliability between the electrodes can be enhanced. In addition, it is possible to prevent electrical connection between electrodes that must not be connected and are adjacent in a lateral direction, and insulation reliability can be enhanced.

In the mounting (particularly primary mounting) of a semiconductor element, the electrode width and the inter-electrode width become narrower. Thus, if solder remains in the region (space) where no electrode is formed, migration tends to occur, and the occurrence of migration is a big problem. In the present invention, the occurrence of migration can be effectively suppressed even when the electrode width and the inter-electrode width are narrow.

In the conventional conductive material, voids may be generated due to water generated on the solder surface during melting of the solder, and there is a problem that connection reliability is lowered by the generated voids. In the conductive material according to the present invention, generation of water can be suppressed by using an acid anhydride curing agent, and generation of voids can be effectively suppressed.

Further, in the conductive material according to the present invention, an acid anhydride thermosetting agent and an organophosphorus compound are used in combination. Although the conductive material using only the acid anhydride thermosetting agent is excellent in heat resistance, moist heat resistance, migration resistance and the like, solder of the conductive particles hardly aggregates on the electrode. The present inventors have found that by using the acid anhydride thermosetting agent and the organophosphorus compound in combination, it is possible to improve problematic cohesion of solder of the conductive particles while taking advantage of characteristics of the conductive material using only the acid anhydride thermosetting agent.

From the viewpoint of more efficiently placing the solder of the conductive particles on the electrode, the viscosity ($\eta$ 25) of the conductive material at 25° C. is preferably 20 Pa·s or more, more preferably 30 Pa·s or more, and preferably 400 Pa·s or less, more preferably 200 Pa·s or less.

The viscosity ($\eta$ 25) can be appropriately adjusted depending on the type of compounded components and the blending amount. The viscosity can be made relatively high by using a filler.

The viscosity ($\eta$ 25) can be measured under conditions of 25° C. and 5 rpm, for example, using an E-type viscometer ("TVE22L" manufactured by Toki Sangyo Co., Ltd.) or the like.

The conductive material is used as a conductive paste, a conductive film, or the like. The conductive paste is preferably an anisotropic conductive paste, and the conductive film is preferably an anisotropic conductive film. From the viewpoint of further placing the solder of the conductive particles on the electrode, the conductive material is preferably a conductive paste.

The conductive material is suitably used for electrical connection of electrodes. The conductive material is preferably a circuit connecting material.

Hereinafter, each component contained in the conductive material will be described.

(Conductive Particles)

The conductive particles electrically connect electrodes of a connection object member. In the conductive particles, an outer surface portion of a conductive portion is made of solder. The conductive particles may be solder particles formed by solder, or may be conductive particles including base particles formed from materials other than solder and a solder portion placed on the surfaces of the base particles. When the conductive particles including base particles formed from materials other than solder and the solder portion placed on the surfaces of the base particles are used, the conductive particles hardly gather on the electrode, and the solder-bonding property between the conductive particles is low. Therefore, there are tendencies that the conductive particles moved on the electrode tend to move outside the electrode, and the effect of suppressing positional displacement between the electrodes tends to be low. Accordingly, the conductive particles are preferably the solder particles formed by solder.

By using the conductive particles in which the outer surface portion of the conductive portion is made of solder, the solder melts to be bonded to the electrode, and the solder conducts between the electrodes. For example, since the solder and the electrode are easily in surface contact, not in point contact, the connection resistance decreases. Further, the use of the conductive particles in which the outer surface portion of the conductive portion is made of solder increases bonding strength between the solder and the electrode, so that peeling between the solder and the electrode more hardly occurs, and conduction reliability effectively increases.

The material for forming the solder (solder portion) is preferably a filler material having a liquidus line of 450° C. or lower in accordance with JIS Z3001: Welding Terms.

Examples of the composition of the solder include metallic compositions including zinc, gold, silver, lead, copper, tin, bismuth and indium. Particularly, a low-melting and lead-free tin-indium-based (eutectic 117° C.) or tin-bismuth-based (eutectic 139° C.) solder is preferable. That is, preferably the solder does not contain lead, and is preferably a solder containing tin and indium or a solder containing tin and bismuth.

The average particle diameter of the conductive particles is preferably 0.5 µm or more, more preferably 1 µm or more, further preferably 3 µm or more, and preferably 100 µm or less, more preferably 60 µm or less, further preferably 50 µm or less, and particularly preferably 40 µm or less. When the average particle diameter of the conductive particles is not less than the above lower limit and not more than the above upper limit, the solder of the conductive particles can be more efficiently placed on the electrode, it is easy to place more solder of the conductive particles between the electrodes, and the conduction reliability further increases.

The particle diameter of the conductive particles is preferably an average particle diameter, and more preferably a number average particle diameter. The average particle diameter of conductive particles is determined by, for example, observing arbitrary 50 conductive particles with an electron microscope or an optical microscope and calculating an average value or performing laser diffraction type particle size distribution measurement.

The variation coefficient of the particle diameter of the conductive particles is preferably 5% or more, more preferably 10% or more, and preferably 40% or less, more preferably 30% or less. When the variation coefficient of the particle diameter is not less than the above lower limit and not more than the above upper limit, the solder can be more efficiently placed on the electrode. However, the variation coefficient of the particle diameter of the conductive particles may be less than 5%.

The variation coefficient (CV value) can be measured as follows.

$$CV \text{ value } (\%)=(\rho/Dn)\times 100$$

ρ: standard deviation of particle diameter of conductive particles

Dn: average value of particle diameter of conductive particles

The shape of the conductive particles is not particularly limited. The shape of the conductive particles may be spherical, and may have a shape other than a spherical shape, such as a flat shape.

The content of the conductive particles in 100% by weight of the conductive material is preferably 1% by weight or more, more preferably 2% by weight or more, further preferably 10% by weight or more, particularly preferably 20% by weight or more, most preferably 30% by weight or more, and preferably 80% by weight or less, more preferably 75% by weight or less, further preferably 70% by weight or less. When the content of the conductive particles is not less than the above lower limit and not more than the above upper limit, the solder of the conductive particles can be more efficiently placed on the electrode, it is easy to place more solder of the conductive particles between the electrodes, and the conduction reliability further increases. From the viewpoint of further increasing the conduction reliability, it is more preferable as the content of the conductive particles is larger.

(Thermosetting Compound)

The conductive material according to the present invention contains a thermosetting compound. The thermosetting compound is a compound curable by heating. Examples of the thermosetting compound include oxetane compounds, epoxy compounds, episulfide compounds, (meth)acrylic compounds, phenol compounds, amino compounds, unsaturated polyester compounds, polyurethane compounds, silicone compounds and polyimide compounds. From the viewpoint of further improving the curability and viscosity of the conductive material and further increasing the conduction reliability, an epoxy compound or an episulfide compound is preferable, and the epoxy compound is more preferable. The conductive material preferably contains an epoxy compound. One kind of the thermosetting compound may be used alone, and two or more kinds thereof may be used in combination.

The epoxy compound is liquid or solid at room temperature (23° C.), and when the epoxy compound is a solid at room temperature, it is preferably an epoxy compound having a fusing temperature of not more than the melting point of the solder.

The content of the thermosetting compound in 100% by weight of the conductive material is preferably 5% by weight or more, more preferably 10% by weight or more, further preferably 15% by weight or more, and preferably 70% by weight or less, more preferably 60% by weight or less, further preferably 50% by weight or less, particularly preferably 40% by weight or less. When the content of the thermosetting compound is not less than the above lower limit and not more than the above upper limit, it is possible to more efficiently place the solder of the conductive particles on the electrode, further suppress positional displacement between the electrodes, and further increase the conduction reliability between the electrodes.

(Acid Anhydride Thermosetting Agent)

The conductive material according to the present invention contains an acid anhydride thermosetting agent. The acid anhydride thermosetting agent thermally cures the thermosetting compound.

As the acid anhydride thermosetting agent, an acid anhydride usually used as a curing agent for thermosetting compounds such as an epoxy compound can be appropriately used. Examples of the acid anhydride thermosetting agent include bifunctional acid anhydride thermosetting agents such as phthalic anhydride, tetrahydrophthalic anhydride, trialkyltetrahydrophthalic anhydride, hexahydrophthalic anhydride, methylhexahydrophthalic anhydride, methyltetrahydrophthalic anhydride, methylbutenyltetrahydrophthalic anhydride, anhydride of phthalic acid derivative, maleic anhydride, nadic anhydride, methylnadic anhydride, glutaric anhydride, succinic anhydride, glycerin bis trimellitic anhydride monoacetate, and ethylene glycol bis trimellitic anhydride, trifunctional acid anhydride thermosetting agents such as trimellitic anhydride, and tetra- or higher functional acid anhydride thermosetting agents such as pyromellitic anhydride, benzophenone tetracarboxylic anhydride, methylcyclohexene tetracarboxylic anhydride, and polyazelaic acid anhydride. One kind of the acid anhydride thermosetting agent may be used alone, and two or more kinds thereof may be used in combination.

From the viewpoint of more efficiently placing the solder of the conductive particles on the electrode and more effectively suppressing generation of voids even when the conductive material is left for a certain period of time, the acid anhydride thermosetting agent is preferably a solid at 25° C.

From the viewpoint of more efficiently placing the solder of the conductive particles on the electrode, the melting point of the acid anhydride thermosetting agent is preferably lower than the melting point of the solder of the conductive particles.

From the viewpoint of more effectively suppressing thermal deterioration of a cured product, the acid anhydride thermosetting agent is preferably a cyclic acid anhydride thermosetting agent. Examples of the cyclic acid anhydride thermosetting agent include trialkyl tetrahydro phthalic anhydride, hexahydro phthalic anhydride, and triacryl tetrahydro phthalic anhydride.

The content of the acid anhydride thermosetting agent in 100% by weight of the conductive material is preferably 5% by weight or more, more preferably 10% by weight or more, and preferably 50% by weight or less, more preferably 40% by weight or less. When the content of the acid anhydride thermosetting agent is not less than the above lower limit, it is easy to sufficiently cure the conductive material, the solder is more efficiently placed on the electrode, and occurrence of migration can be suppressed more effectively. When the content of the acid anhydride thermosetting agent is not more than the above upper limit, excessive acid anhydride thermosetting agent that is not involved in curing hardly remains after curing, generation of voids can be suppressed, and heat resistance of a cured product is further enhanced.

The content of the acid anhydride thermosetting agent is preferably 10 parts by weight or more, more preferably 20 parts by weight or more, and preferably 200 parts by weight or less, more preferably 150 parts by weight or less based on 100 parts by weight of the thermosetting compound. When the content of the acid anhydride thermosetting agent is not less than the above lower limit, it is easy to sufficiently cure the conductive material, the solder is more efficiently placed on the electrode, and occurrence of migration can be suppressed more effectively. When the content of the acid anhydride thermosetting agent is not more than the above upper limit, excessive acid anhydride thermosetting agent that is not involved in curing hardly remains after curing, generation of voids can be suppressed, and heat resistance of a cured product is further enhanced.

(Other Thermosetting Agents)

The conductive material according to the present invention may or may not contain another thermosetting agent which is not the acid anhydride thermosetting agent. Examples of the another thermosetting agent include a thiol curing agent such as an imidazole curing agent, an amine curing agent, a phenol curing agent, and a polythiol curing agent, a thermal cationic initiator (thermal cationic curing agent), and a thermal radical generator. One kind of the above other thermosetting agents may be used alone, and two or more kinds thereof may be used in combination.

From the viewpoint of further enhancing storage stability and further enhancing insulation reliability, it is more preferable as the content of the another thermosetting agent is smaller. When the another thermosetting agent is used, the content of the another thermosetting agent is preferably 5 parts by weight or less, more preferably 1 part by weight or less based on 100 parts by weight of the thermosetting compound. From the viewpoint of further enhancing storage stability and further enhancing insulation reliability, it is preferable that the conductive material does not contain the another thermosetting agent.

The imidazole curing agent is not particularly limited. Examples of the imidazole curing agent include 2-methylimidazole, 2-ethyl-4-methylimidazole, 1-cyanoethyl-2-phenylimidazole, 1-cyanoethyl-2-phenylimidazolium trimellitate, 2,4-diamino-6-[2'-methylimidazolyl-(1')]-ethyl-s-triazine, and 2,4-diamino-6-[2'-methylimidazolyl-(1')]-ethyl-s-triazine isocyanuric acid adduct. From the viewpoint of further enhancing the storage stability, it is preferable that the conductive material does not contain the imidazole curing agent.

The thiol curing agent is not particularly limited. Examples of the thiol curing agent include trimethylolpropane tris-3-mercaptopropionate, pentaerythritol tetrakis-3-mercaptopropionate and dipentaerythritol hexa-3-mercaptopropionate. From the viewpoint of further enhancing the insulation reliability, it is preferable that the conductive material does not contain the thiol curing agent.

The amine curing agent is not particularly limited. Examples of the amine curing agent include hexamethylenediamine, octamethylenediamine, decamethylenediamine, 3,9-bis(3-aminopropyl)-2,4,8,10-tetraspiro[5.5]undecane, bis(4-aminocyclohexyl)methane, metaphenylenediamine and diaminodiphenyl sulfone. From the viewpoint of further enhancing the storage stability, it is preferable that the conductive material does not contain the amine curing agent.

Examples of the thermal cationic initiator (thermal cationic curing agent) include iodonium-based cationic curing agents, oxonium-based cationic curing agents and sulfonium-based cationic curing agents. Examples of the iodonium-based cationic curing agent include bis(4-tert-butylphenyl)iodonium hexafluorophosphate. Examples of the oxonium-based cationic curing agent include trimethyloxonium tetrafluoroborate. Examples of the sulfonium-based cationic curing agent include tri-p-tolylsulfonium hexafluorophosphate. From the viewpoint of further enhancing connection reliability, it is preferable that the conductive material does not contain the thermal cationic initiator (thermal cationic curing agent).

The thermal radical generator is not particularly limited. Examples of the thermal radical generator include azo compounds and organic peroxides. Examples of the azo compound include azobisisobutyronitrile (AIBN). Examples of the organic peroxide include di-tert-butyl peroxide and methyl ethyl ketone peroxide. From the viewpoint of further enhancing the connection reliability, it is preferable that the conductive material does not contain the thermal radical generator.

(Organophosphorus Compound)

The conductive material according to the present invention contains an organophosphorus compound. One kind of the organophosphorus compound may be used alone, and two or more kinds thereof may be used in combination.

From the viewpoint of more efficiently placing the solder of the conductive particles on the electrode, the organophosphorus compound is preferably an organophosphonium salt, an organophosphorus acid, an organophosphorus acid ester, an organophosphonic acid, an organophosphonic acid ester, an organophosphinic acid, or an organophosphinic acid ester. From the viewpoint of more efficiently placing the solder of the conductive particles on the electrode, the organophosphorus compound is more preferably an organophosphonium salt.

The organophosphonium salt may be formed of phosphonium ion and its counter ion, and examples thereof include "Hishicolin" series manufactured by Nippon Chemical Industrial Co., Ltd. as a commercially available product. One kind of the organophosphonium salt may be used alone, and two or more kinds thereof may be used in combination.

The organophosphorus acid, the organophosphorus acid ester, the organophosphonic acid, the organophosphonic acid ester, the organophosphinic acid, and the organophosphinic acid ester are not particularly limited, and conventionally known compounds or commercially available products may be used. One kind of them may be used alone, and two or more kinds thereof may be used in combination.

From the viewpoint of more efficiently placing the solder of the conductive particles on the electrode, the melting point of the organophosphorus compound is preferably 170° C. or lower. From the viewpoint of more efficiently placing the solder of the conductive particles on the electrode, the organophosphorus compound is preferably in a liquid state at 25° C.

From the viewpoint of more efficiently placing the solder of the conductive particles on the electrode, the melting point of the organophosphorus compound is preferably lower than the melting point of the acid anhydride thermosetting agent.

The content of the organophosphorus compound is preferably 0.5 parts by weight or more, more preferably 0.8 parts by weight or more, and preferably 10 parts by weight or less, more preferably 8 parts by weight or less with respect to 100 parts by weight of the acid anhydride thermosetting agent. When the content of the organophosphorus compound is not less than the above lower limit and not more than the above upper limit, it is possible to more efficiently place the solder of the conductive particles on the electrode even when the conductive material is left for a certain period of time.

(Flux)

The conductive material preferably contains a flux. By using the flux, the solder of the conductive particles can be more effectively placed on the electrode. The flux is not particularly limited. As the flux, fluxes that are generally used for solder joint can be used.

Examples of the flux include zinc chloride, mixtures of zinc chloride and an inorganic halide, mixtures of zinc chloride and an inorganic acid, molten salts, phosphoric acid, derivatives of phosphoric acid, organic halides, hydrazine, organic acids and pine resins. One kind of the flux may be used alone, and two or more kinds thereof may be used in combination.

Examples of the molten salt include ammonium chloride. Examples of the organic acid include lactic acid, citric acid, stearic acid, glutamic acid, malic acid and glutaric acid. Examples of the pine resin include an activated pine resin and a non-activated pine resin. The flux is preferably an organic acid having two or more carboxyl groups or a pine resin. The flux may be an organic acid having two or more carboxyl groups or a pine resin. By using the organic acid having two or more carboxyl groups, or the pine resin, the conduction reliability between the electrodes further increases.

The pine resin is a rosin having abietic acid as a main component. The flux is preferably a rosin, and more preferably abietic acid. When this preferable flux is used, the conduction reliability between electrodes further increases.

The activation temperature (melting point) of the flux is preferably 50° C. or more, more preferably 70° C. or more, further preferably 80° C. or more, and preferably 200° C. or less, more preferably 190° C. or less, still more preferably 160° C. or less, even more preferably 150° C. or less, further more preferably 140° C. or less. When the activation temperature of the flux is not less than the above lower limit and not more than the above upper limit, the flux effect is more effectively exhibited, and the solder of the conductive particles is more efficiently placed on the electrode. The activation temperature (melting point) of the flux is preferably 80° C. or more and 190° C. or less. The activation temperature (melting point) of the flux is particularly preferably 80° C. or more and 140° C. or less.

Examples of the flux having an activation temperature (melting point) of 80° C. or more and 190° C. or less include dicarboxylic acids such as succinic acid (melting point 186° C.), glutaric acid (melting point 96° C.), adipic acid (melting point 152° C.), pimelic acid (melting point 104° C.), and suberic acid (melting point 142° C.), benzoic acids (melting point 122° C.), and malic acids (melting point 130° C.)

The boiling point of the flux is preferably 200° C. or less.

The flux is preferably a flux that releases cations by heating. By using the flux that releases cations by heating, the solder of the conductive particles can be more efficiently placed on the electrode.

Examples of the flux that releases cations by heating include the thermal cationic initiator (thermal cationic curing agent).

The flux is more preferably a salt of an acid compound and a base compound. The acid compound preferably has an effect of cleaning a metal surface, and the base compound preferably has an action of neutralizing the acid compound. The flux is preferably a neutralization reaction product of the acid compound and the base compound. One kind of the flux may be used alone, and two or more kinds thereof may be used in combination.

From the viewpoint of more efficiently placing the solder of the conductive particles on the electrode, the melting point of the flux is preferably lower than the melting point of the solder of the conductive particles, more preferably lower by 5° C. or more, further preferably by 10° C. or more, than the melting point of the solder. However, the melting point of the flux may be higher than the melting point of the solder of the conductive particles. The use temperature of the conductive material is usually not less than the melting point of the solder of the conductive particles, and when the melting point of the flux is not more than the use temperature of the conductive material, even if the melting point of the flux is higher than the melting point of the solder of the conductive particles, the flux can sufficiently exhibit the performance as a flux. For example, the use temperature of the conductive material is 150° C. or more, and in a conductive material containing solder (Sn42Bi58: melting point 139° C.) in the conductive particles and a flux (melting point 146° C.) which is a salt of malic acid and benzylamine, the flux which is the salt of malic acid and benzylamine exhibits a sufficient flux effect.

From the viewpoint of more efficiently placing the solder of the conductive particles on the electrode, the melting point of the flux is preferably lower than the reaction initiation temperature of the acid anhydride thermosetting agent, more preferably lower by 5° C. or more, further preferably by 10° C. or more, than the reaction initiation temperature of the acid anhydride thermosetting agent.

The acid compound is preferably an organic compound having a carboxyl group. Examples of the acid compound include aliphatic carboxylic acids such as malonic acid, succinic acid, glutaric acid, adipic acid, pimelic acid, suberic acid, azelaic acid, sebacic acid, citric acid, and malic acid, cycloaliphatic carboxylic acids such as cyclohexyl carboxylic acid and 1,4-cyclohexyl dicarboxylic acid, and aromatic carboxylic acids such as isophthalic acid, terephthalic acid, trimellitic acid, and ethylenediaminetetraacetic acid. The acid compound is preferably glutaric acid, azelaic acid, or malic acid.

The base compound is preferably an organic compound having an amino group. Examples of the base compound include diethanolamine, triethanolamine, methyldiethanolamine, ethyldiethanolamine, cyclohexylamine, dicyclohexylamine, benzylamine, benzhydrylamine, 2-methylbenzylamine, 3-methylbenzylamine, 4-tert-butylbenzylamine, N-methylbenzylamine, N-ethylbenzylamine, N-phenylbenzylamine, N-tert-butylbenzylamine, N-isopropylbenzylamine, N,N-dimethylbenzylamine, imidazole compounds, and triazole compounds. The base compound is preferably benzylamine, 2-methylbenzylamine, or 3-methylbenzylamine.

The flux may be dispersed in the conductive material or may be attached on the surface of the conductive particles. From the viewpoint of more effectively enhancing the flux effect, it is preferable that the flux is attached on the surface of the conductive particles.

From the viewpoint of further increasing storage stability of the conductive material, the flux is preferably a solid at 25° C., and it is preferable that the flux is dispersed as a solid in the conductive material at 25° C.

The content of the flux in 100% by weight of the conductive material is preferably 0.5% by weight or more, and preferably 30% by weight or less, more preferably 25% by weight or less. When the content of the flux is not less than the above lower limit and not more than the above upper limit, it is more difficult for an oxide film to be formed on the solder and the electrode surface, and, in addition, the oxide film formed on the solder and the electrode surface can be more effectively removed.

(Filler)

A filler may be added to the conductive material. The filler may be an organic filler or an inorganic filler. The addition of the filler can uniformly aggregate the conductive particles on all the electrodes on the substrate.

It is preferable that the conductive material does not contain the filler or contains the filler in an amount of 5% by weight or less. When a crystalline thermosetting compound is used, as the content of the filler is smaller, the solder more easily moves on the electrode.

The content of the filler in 100% by weight of the conductive material is preferably 0% by weight (not contained) or more, and preferably 5% by weight or less, more preferably 2% by weight or less, further preferably 1% by weight or less. When the content of the filler is not less than the above lower limit and not more than the above upper limit, the conductive particles are more efficiently placed on the electrode.

(Other Components)

If necessary, the conductive material may contain various additives such as a filler, an extender, a softener, a plasticizer, a thixotropic agent, a leveling agent, a polymerization catalyst, a curing catalyst, a colorant, an antioxidant, a thermal stabilizer, a light stabilizer, an ultraviolet absorber, a lubricant, an antistatic agent, and a flame retardant.

(Connection Structure and Method for Producing Connection Structure)

A connection structure according to the present invention includes a first connection object member having at least one first electrode on its surface, a second connection object member having at least one second electrode on its surface, and a connection portion connecting the first connection object member and the second connection object member. In the connection structure according to the present invention, the material of the connection portion is the above-described conductive material. In the connection structure according to the present invention, the first electrode and the second electrode are electrically connected by a solder portion in the connection portion.

A method for producing a connection structure according to the present invention includes a process of placing the conductive material on a surface of a first connection object member, having at least one first electrode on its surface, with the use of the above-described conductive material. The method for producing a connection structure according to the present invention includes a process of disposing a second connection object member, having at least one second electrode on its surface, on a surface opposite to the first connection object member side of the conductive material such that the first electrode and the second electrode face each other. The method for producing a connection structure according to the present invention includes a process of heating the conductive material to a temperature not less than a melting point of solder of the conductive particles to form a connection portion, connecting the first connection object member and the second connection object member, with the conductive material and electrically connecting the first electrode and the second electrode via a solder portion in the connection portion.

In the connection structure and the method for producing a connection structure according to the present invention, since a specific conductive material is used, the solder of the conductive particles is likely to gather between the first electrode and the second electrode, and the solder can be efficiently placed on the electrode (line). In addition, such a phenomenon that a portion of the solder is placed in a region (space) where no electrode is formed is suppressed, and the amount of the solder placed in the region where no electrode is formed can be considerably reduced. Accordingly, the conduction reliability between the first electrode and the second electrode can be enhanced. In addition, it is possible to prevent electrical connection between electrodes that must not be connected and are adjacent in a lateral direction, and insulation reliability can be enhanced.

In order to efficiently place the solder of the conductive particles on the electrode and considerably reduce the amount of the solder placed in the region where no electrode is formed, preferably the conductive material is not a conductive film, and a conductive paste is used.

The thickness of the solder portion between the electrodes is preferably 10 μm or more, more preferably 20 μm or more, and preferably 100 μm or less, more preferably 80 μm or less. A solder wetting area on the surface of the electrode (an area where the solder is in contact in 100% of the exposed area of the electrode) is preferably 50% or more, more preferably 60% or more, further preferably 70% or more, and preferably 100% or less.

Hereinafter, specific embodiments of the present invention will be described with reference to the drawings.

FIG. 1 is a cross-sectional view schematically showing a connection structure obtained using a conductive material according to one embodiment of the present invention.

A connection structure 1 shown in FIG. 1 includes a first connection object member 2, a second connection object member 3, and a connection portion 4 connecting the first connection object member 2 and the second connection object member 3. The connection portion 4 is formed of the above-described conductive material. In the present embodiment, the conductive material contains conductive particles, a thermosetting compound, an acid anhydride thermosetting agent, and an organophosphorus compound. In the present embodiment, the conductive material contains solder particles as the conductive particles. The thermosetting compound and the thermosetting agent are referred to as thermosetting components.

The connection portion 4 has a solder portion 4A in which a plurality of solder particles gather and are bonded to each other and a cured product portion 4B in which a thermosetting component is thermally cured.

The first connection object member 2 has a plurality of first electrodes 2a on its surface (upper surface). The second connection object member 3 has a plurality of second electrodes 3a on its surface (lower surface). The first electrode 2a and the second electrode 3a are electrically connected by the solder portion 4A. Accordingly, the first connection object member 2 and the second connection object member 3 are electrically connected by the solder portion 4A. In the connection portion 4, no solder exists in a region (a site of the cured product portion 4B) different from the solder portion 4A gathering between the first electrode 2a and the second electrode 3a. In the region (the site of the cured product portion 4B) different from the solder portion 4A, there is no solder away from the solder portion 4A. A small amount of solder may exist in the region (the site of the cured product portion 4B) different from the solder portion 4A gathering between the first electrode 2a and the second electrode 3a.

As shown in FIG. 1, in the connection structure 1, a plurality of solder particles gather between the first electrode 2a and the second electrode 3a, and after the plurality of solder particles melt, a melt of the solder particles is wetted and spreads over the surface of the electrode and is then solidified to form the solder portion 4A. Thus, a connection area between the solder portion 4A and the first electrode 2a and a connection area between the solder portion 4A and the second electrode 3a increase. That is, by using the solder particles, the contact area of the solder portion 4A and the first electrode 2a and the contact area of the solder portion 4A and the second electrode 3a are large as compared to a case where a conductive particle with an outer surface portion of a conductive portion formed of a metal such as nickel, gold or copper is used. Thus, the conduction reliability and the connection reliability in the connection structure 1 are enhanced. The conductive material may contain a flux. When the flux is used, heating causes the flux to be gradually deactivated.

In the connection structure 1 shown in FIG. 1, all of the solder portions 4A are located in a region where the first and second electrodes 2a and 3a face each other. In a connection structure 1X of the modified example shown in FIG. 3, only a connection portion 4X differs from the connection structure 1 shown in FIG. 1. The connection portion 4X has a solder portion 4XA and a cured product portion 4XB. As in the connection structure 1X, most of the solder portion 4XA is located in a region where the first and second electrodes 2a and 3a face each other, and a portion of the solder portion 4XA may protrude laterally from the region where the first and second electrodes 2a and 3a face each other. The solder portion 4XA protruding laterally from the region where the first and second electrodes 2a and 3a face each other is a portion of the solder portion 4XA and is not solder away from the solder portion 4XA. In the present embodiment, the amount of solder away from the solder portion can be reduced; however, solder away from the solder portion may exist in a cured product portion.

The connection structure 1 can be easily obtained by reducing the use amount of solder particles. The connection structure 1X can be easily obtained by increasing the use amount of solder particles.

When viewing a portion where the first electrode and the second electrode face each other in a stacking direction of the first electrode, the connection portion, and the second electrode, it is preferable that the solder portion in the connection portion is placed in 50% or more of 100% of the area of the portion where the first electrode and the second electrode face each other. When viewing a portion where the first electrode and the second electrode face each other in a stacking direction of the first electrode, the connection portion, and the second electrode, it is more preferable that the solder portion in the connection portion is placed in 60% or more of 100% of the area of the portion where the first electrode and the second electrode face each other. When viewing a portion where the first electrode and the second electrode face each other in a stacking direction of the first electrode, the connection portion, and the second electrode, it is further preferable that the solder portion in the connection portion is placed in 70% or more of 100% of the area of the portion where the first electrode and the second electrode face each other. When viewing a portion where the first electrode and the second electrode face each other in a stacking direction of the first electrode, the connection portion, and the second electrode, it is particularly preferable that the solder portion in the connection portion is placed in 80% or more of 100% of the area of the portion where the first electrode and the second electrode face each other. When viewing a portion where the first electrode and the second electrode face each other in a stacking direction of the first electrode, the connection portion, and the second electrode, it is most preferable that the solder portion in the connection portion is placed in 90% or more of 100% of the area of the portion where the first electrode and the second electrode face each other. By satisfying the above preferable aspect, the conduction reliability can be further enhanced.

Next, an example of a method for producing the connection structure 1 using the conductive material according to one embodiment of the present invention will be described.

First, the first connection object member 2 having the first electrode 2a on its surface (upper surface) is prepared. Then, as shown in FIG. 2(a), a conductive material 11 containing a thermosetting component 11B and a plurality of solder particles 11A is placed on the surface of the first connection object member 2 (first process). The conductive material 11 contains a thermosetting compound and a thermosetting agent as the thermosetting component 11B.

The conductive material 11 is placed on the surface of the first connection object member 2 on which the first electrode 2a is provided. After the conductive material 11 is placed thereon, the solder particles 11A are arranged both on the first electrode 2a (line) and on a region (space) where the first electrode 2a is not formed.

Although the method for placing the conductive material 11 is not particularly limited, application by a dispenser, screen printing, discharge by an inkjet apparatus, and the like can be adopted.

On the other hand, the second connection object member 3 having the second electrode 3a on its surface (lower surface) is prepared. Then, as shown in FIG. 2(b), in the conductive material 11 on the surface of the first connection object member 2, the second connection object member 3 is placed on a surface of the conductive material 11, which is opposite to the first connection object member side (second process). The second connection object member 3 is placed on the surface of the conductive material 11 from the second electrode 3a side. At this time, the first electrode 2a and the second electrode 3a face each other.

Then, the conductive material 11 is heated to a temperature not less than the melting point of the solder particles 11A (third process). Preferably, the conductive material 11 is heated to a temperature not less than the curing temperature of the thermosetting component 11B (thermosetting compound). During this heating, the solder particles 11A existing in the region where no electrode is formed gather between the first electrode 2a and the second electrode 3a (selfaggregation effect). When a conductive paste is used instead of a conductive film, the solder particles 11A effectively gather between the first electrode 2a and the second electrode 3a. The solder particles 11A melt and are bonded to each other. The thermosetting component 11B is thermally cured. As a result, as shown in FIG. 2(c), the connection portion 4 connecting the first connection object member 2 and the second connection object member 3 is formed by the conductive material 11. The connection portion 4 is formed by the conductive material 11, the solder portion 4A is formed by bonding the plurality of solder particles 11A, and the thermosetting component 11B is thermally cured to form the cured product portion 4B. If the solder particles 11A move sufficiently, it is not necessary to keep temperature constant from a start of movement of the solder particles 11A not located between the first electrode 2a and the second electrode 3a to completion of movement of the solder particles 11A between the first electrode 2a and the second electrode 3a.

In the present embodiment, it is preferable not to perform pressurization in the second process and the third process. In this case, the weight of the second connection object member 3 is added to the conductive material 11. Thus, when the connection portion 4 is formed, the solder particles 11A effectively gather between the first electrode 2a and the second electrode 3a. If pressurization is performed in at least one of the second process and the third process, there is a high tendency that the action of the solder particles gathering between the first electrode and the second electrode is hindered.

In the present embodiment, since pressurization is not performed, when the second connection object member is superimposed on the first connection object member coated with the conductive material, even in a misalignment state between the first electrode and the second electrode, the misalignment can be corrected, and the first electrode and the second electrode can be connected (self-alignment effect). This is because the case where an area where solder between the first electrode and the second electrode is in contact with other components of the conductive material is minimum results in more stabilization in terms of energy of molten solder self-aggregated between the first electrode and the second electrode, so that a force for forming a connection structure suitable for alignment which is a connection structure with the minimum area is applied. In this case, it is desirable that the conductive material is not cured, and the viscosity of components other than the conductive particles of the conductive material is sufficiently low at the temperature and time.

The viscosity of the conductive material at the melting point of the solder is preferably 50 Pa·s or less, more preferably 10 Pa·s or less, further preferably 1 Pa·s or less, and preferably 0.1 Pa·s or more, more preferably 0.2 Pa·s or more. When the viscosity is not more than the above upper limit, the solder of the conductive particles can efficiently aggregate. When the viscosity is not less than the above lower limit, voids in the connection portion are suppressed, and it is possible to prevent the conductive material from protruding to portions other than the connection portion.

The viscosity of the conductive material at the melting point of the solder is measured as follows.

The viscosity of the conductive material at the melting point of the solder can be measured using STRESSTECH (manufactured by EOLOGICA) or the like under conditions of a strain control of 1 rad, a frequency of 1 Hz, a heating rate of 20° C./min, and a measurement temperature range of 25° C. to 200° C. (provided that the temperature upper limit is taken as the melting point of the solder when the melting point of the solder is more than 200° C.) From the measurement results, the viscosity at the melting point (° C.) of the solder is evaluated.

Thus, the connection structure 1 shown in FIG. 1 is obtained. The second process and the third process may be performed continuously. After the second process is performed, a stack of the first connection object member 2, the conductive material 11, and the second connection object member 3, to be obtained, is moved to a heating section, and the third process may be performed. In order to perform the heating, the stack may be placed on a heating member, and the stack may be placed in a heated space.

The heating temperature in the third process is preferably 140° C. or more, more preferably 160° C. or more, and preferably 450° C. or less, more preferably 250° C. or less, further preferably 200° C. or less.

Examples of the heating method in the third process include a method of heating the entire connection structure in a reflow oven or an oven to a temperature not less than the melting point of solder of the conductive particles and a temperature not less than the curing temperature of the thermosetting component, and a method of locally heating only the connection portion of the connection structure.

Examples of instruments used for the local heating method include a hot plate, a heat gun for applying hot air, a soldering iron, and an infrared heater.

When local heating is performed using a hot plate, it is preferable that directly under the connection portion, an upper surface of the hot plate is formed with a metal with a high thermal conductivity, and in other portions not preferable to be heated, the upper surface of the hot plate is formed with a material with a low thermal conductivity such as a fluororesin.

The first and second connection object members are not particularly limited. Specific examples of the first and second connection object members include electronic components such as a semiconductor chip, a semiconductor package, an LED chip, an LED package, a capacitor and a diode, and electronic components such as a resin film, a printed board, a flexible printed board, a flexible flat cable, a rigid flexible substrate, a glass epoxy substrate, and a circuit board such as a glass substrate. The first and second connection object members are preferably electronic components.

It is preferable that at least one of the first connection object member and the second connection object member is a resin film, a flexible printed board, a flexible flat cable or a rigid flexible substrate. The second connection object member is preferably a resin film, a flexible printed board, a flexible flat cable or a rigid flexible substrate. The resin film, the flexible printed board, the flexible flat cable and the rigid flexible substrate have high flexibility and relatively light weight. When a conductive film is used to connect such a connection object member, there is a tendency that solder is less likely to gather on the electrode. On the other hand, by using a conductive paste, even if a resin film, a flexible printed board, a flexible flat cable or a rigid flexible substrate is used, solder is efficiently gathered on the electrode, whereby the conduction reliability between the electrodes can be sufficiently enhanced. When a resin film, a flexible printed board, a flexible flat cable or a rigid flexible substrate is used, compared to the case of using other connection object members such as a semiconductor chip, the conduction reliability between the electrodes due to no pressurization can be obtained more effectively.

Examples of the electrode provided on the connection object member include metal electrodes such as a gold electrode, a nickel electrode, a tin electrode, an aluminum electrode, a copper electrode, a molybdenum electrode, a silver electrode, a SUS electrode, and a tungsten electrode. When the connection object member is a flexible printed board, the electrode is preferably a gold electrode, a nickel electrode, a tin electrode, a silver electrode or a copper electrode. When the connection object member is a glass substrate, the electrode is preferably an aluminum electrode, a copper electrode, a molybdenum electrode, a silver electrode or a tungsten electrode. When the electrode is an aluminum electrode, it may be an electrode formed only of aluminum, or may be an electrode with an aluminum layer stacked on the surface of a metal oxide layer. Examples of the material of the metal oxide layer include indium oxide doped with a trivalent metal element and zinc oxide doped with a trivalent metal element. Examples of the trivalent metal element include Sn, Al, and Ga.

Peripherals, area arrays, and the like exist in the form of the connection object member. As a feature of each member, in a peripheral substrate, the electrode exists only at an outer peripheral portion of the substrate. In an area array substrate, the electrode exists in a plane.

The present invention will be specifically described below by way of Examples and Comparative Examples. The present invention is not limited only to the following examples.

Thermosetting component (thermosetting compound):
(1) "EP-3300" manufactured by ADEKA Corporation, benzophenone type epoxy compound
(2) "YDF-8170C" manufactured by Nippon Steel & Sumikin Chemical Co., Ltd., bisphenol F type epoxy resin Thermosetting component (thermosetting agent):
(1) "HN-5500" manufactured by Hitachi Chemical Co., Ltd., acid anhydride thermosetting agent, liquid state at 25° C.
(2) "RIKACID TH" manufactured by New Japan Chemical Co., Ltd., acid anhydride thermosetting agent, solid at 25° C.
(3) "MEH-8000H" manufactured by Meiwa Plastic Industries, Ltd., phenol novolac thermosetting agent
(4) "TMMP" manufactured by SC Organic Chemical Co., Ltd., polyfunctional thiol thermosetting agent Organophosphorus Compound:
(1) "Hishicolin PX-4MP" manufactured by Nippon Chemical Industrial Co., Ltd., organophosphonium salt, liquid state at 25° C.
(2) "Hishicolin PX-4FB" manufactured by Nippon Chemical Industrial Co., Ltd., organophosphonium salt, melting point: 99° C.
(3) "Hishicolin PX-4B" manufactured by Nippon Chemical Industrial Co., Ltd., organophosphonium salt, melting point: 112° C.
(4) "Hishicolin PX-4ET" manufactured by Nippon Chemical Industrial Co., Ltd., organophosphonium salt, liquid state at 25° C.
(5) "Hishicolin PX-4PB" manufactured by Nippon Chemical Industrial Co., Ltd., organophosphonium salt, melting point: 230° C.
(6) "Phenylphosphonic acid" manufactured by Tokyo Chemical Industry Co., Ltd., organophosphonic acid, melting point: 162° C.
(7) "Phenylphosphinic acid" manufactured by Tokyo Chemical Industry Co., Ltd., organophosphinic acid, melting point: 85° C.
(8) "Phenyl phosphate" manufactured by Tokyo Chemical Industry Co., Ltd., phosphate ester, melting point: 100° C.

Conductive Particles:
(1) "Sn42Bi58" manufactured by Mitsui Mining & Smelting Co., Ltd., solder particles Sn42Bi58

Examples 1 to 9 and Comparative Examples 1 to 4

(1) Preparation of Anisotropic Conductive Paste
Components shown in Tables 1 and 2 below were compounded in blending amounts shown in Tables 1 and 2 to obtain an anisotropic conductive paste (2) Production of Connection Structure (Area Array Substrate)

(Specific Method for Producing Connection Structure Under Condition A)

A connection structure was produced as follows by using the anisotropic conductive paste immediately after production.

As the first connection object member, there was prepared a semiconductor chip in which copper electrodes with a diameter of 250 μm were arranged at a pitch of 400 μm in an area array on a surface of a semiconductor chip body (size: 5×5 mm, thickness: 0.4 mm), and a passivation film (polyimide, thickness: 5 μm, opening diameter for electrode portion: 200 μm) was formed on the outermost surface. The number of the copper electrodes is 100 in total, i.e., 10 electrodes×10 electrodes, per semiconductor chip.

As the second connection object member, there was prepared a glass epoxy substrate in which copper electrodes were arranged on a surface of a glass epoxy substrate body (size: 20×20 mm, thickness: 1.2 mm, material: FR-4) so as to have the same pattern as the electrodes of the first connection object member, and a solder resist film was formed in a region where no copper electrode was arranged. A step between a surface of the copper electrode and a surface of the solder resist film is 15 μm, and the solder resist film protrudes more than the copper electrode.

The anisotropic conductive paste immediately after production was applied to an upper surface of the glass epoxy substrate to have a thickness of 100 μm to form an anisotropic conductive paste layer. Then, a semiconductor chip was stacked on an upper surface of the anisotropic conductive paste layer such that the electrodes faced each other. The weight of the semiconductor chip is added to the anisotropic conductive paste layer. From this state, heating was performed to increase the temperature of the anisotropic conductive paste layer to 139° C. (melting point of solder) after 5 seconds from the beginning of temperature raising. In addition, after 15 seconds from the beginning of temperature raising, heating was performed such that the temperature of the anisotropic conductive paste layer increased to 160° C., and the anisotropic conductive paste layer was cured to obtain a connection structure. During heating, pressurization was not performed.

(Specific Method for Producing Connection Structure Under Condition B)

A connection structure was produced in the same manner as the condition A except that the following changes were made.

Changes from Condition A to Condition B:
The anisotropic conductive paste immediately after production was applied to the upper surface of the glass epoxy substrate to have a thickness of 100 μm to form an anisotropic conductive paste layer, and then the anisotropic conductive paste layer was left for 6 hours in an environment of 25° C. and a humidity of 50%. After leaving, a semiconductor chip was stacked on the upper surface of the anisotropic conductive paste layer such that the electrodes faced each other.

(Viscosity of Conductive Material at 25° C.)

The viscosity (η 25) of the produced conductive material at 25° C. was measured under conditions of 25° C. and 5 rpm using an E-type viscometer ("TVE22L" manufactured by Toki Sangyo Co., Ltd.).

(Evaluation)

(1) Moist Heat Resistance

The anisotropic conductive paste was thermally cured at 170° C. for 1 hour to obtain a first cured product having a shape of 5 mm×30 mm (thickness: 0.5 mm). The obtained first cured product was left for 100 hours in an environment of 110° C. and a humidity of 85% to obtain a second cured product. It was observed with a microscope whether or not the shape of the second cured product changed as compared to the shape of the first cured product, and moist heat resistance was evaluated. The moist heat resistance was judged according to the following criteria.

[Assessment Criteria for Moist Heat Resistance]

◯: The shape of the second cured product does not change compared to the shape of the first cured product Δ: The shape of the second cured product slightly changes compared to the shape of the first cured product ×: The shape of the second cured product largely changes compared to the shape of the first cured product (2) Placement Accuracy of Solder on Electrode In the connection structure obtained under the condition A and the condition B, when viewing a portion where the first electrode and the second electrode faced each other in the stacking direction of the first electrode, the connection portion and the second electrode, a ratio X of an area where the solder portion in the connection portion was placed relative to 100% of the area of the portion where the first electrode and the second electrode faced each other was evaluated. The placement accuracy of the solder on the electrode was judged according to the following criteria.

[Assessment Criteria for Placement Accuracy of Solder on Electrode]

◯◯: The ratio X is 70% or more

◯: The ratio X is 60% or more and less than 70%

Δ: The ratio X is 50% or more and less than 60%

×: The ratio X is less than 50%

(3) Conduction Reliability Between Upper and Lower Electrodes

In the connection structure (n=15) obtained under the condition A, each connection resistance per connecting place between upper and lower electrodes was measured by a four-terminal method. An average value of the connection resistance was calculated. From the relationship of voltage=current×resistance, the connection resistance can be obtained by measuring the voltage when a constant current flows. The conduction reliability was judged according to the following criteria.

[Assessment Criteria for Conduction Reliability]

◯◯: The average value of connection resistances is 50 mΩ or less

◯: The average value of connection resistances is more than 50 mΩ and 70 mΩ or less Δ: The average value of connection resistances is more than 70 mΩ and 100 mΩ or less ×: The average value of connection resistances is more than 100 mΩ, or a connection failure occurs (4) Insulation Reliability (Migration) Between Electrodes Adjacent in Lateral Direction After the connection structure (n=15) obtained under the condition A was left for 100 hours in an environment of 110° C. and a humidity of 85%, 5 V was applied between the electrodes adjacent in the lateral direction, and the resistance value was measured at 25 places. The insulation reliability (migration) was judged according to the following criteria.

[Assessment Criteria for Insulation Reliability (Migration)]

◯◯: The average value of connection resistance is $10^7 \Omega$ or more

◯: The average value of connection resistances is $10^6 \Omega$ or more and less than $10^7 \Omega$ Δ: The average value of connection resistances is $10^5 \Omega$ or more and less than $10^6 \Omega$ ×: The average value of connection resistances is less than $10^5 \Omega$ (5) Presence of Voids The connection structure (n=15) obtained under the condition A was observed using an ultrasonic inspection imaging device ("C-SAM D9500®" manufactured by Nippon BARNES Company Ltd.). The presence of voids was judged according to the following criteria.

[Assessment Criteria for Voids]

◯: The area of a void generation portion to the area of a semiconductor chip is less than 1%

Δ: The area of the void generation portion to the area of the semiconductor chip is 1% or more and less than 5%

×: The area of the void generation portion to the area of the semiconductor chip is 5% or more The results are shown in the following Tables 1 and 2.

TABLE 1

| | | | Example 1 | Example 2 | Example 3 | Example 4 | Example 5 | Example 6 | Example 7 | Example 8 | Example 9 |
|---|---|---|---|---|---|---|---|---|---|---|---|
| Compounded component (part(s) by weight) | Thermosetting compound | EP-3300 | 10.2 | 10.2 | 10.2 | 10.2 | 10.2 | 10.2 | 10.2 | 10.2 | 26.5 |
| | | YDF-8170C | 10.2 | 10.2 | 10.2 | 10.2 | 10.2 | 10.2 | 10.2 | 10.2 | |
| | Thermosetting agent | HN-5500 | | | | | | | | | 13.5 |
| | | RIKACID TH | 19.6 | 19.6 | 19.6 | 19.6 | 19.6 | 19.6 | 19.6 | 19.6 | |
| | | MEH-8000H | | | | | | | | | |
| | | TMMP | | | | | | | | | |
| | Organophosphorus compound | Hishicolin PX-4MP | 0.4 | | | | | | | | 0.4 |
| | | Hishicolin PX-4FB | | 0.4 | | | | | | | |
| | | Hishicolin PX-4B | | | 0.4 | | | | | | |
| | | Hishicolin PX-4ET | | | | 0.4 | | | | | |
| | | Hishicolin PX-4PB | | | | | 0.4 | | | | |
| | | Phenylphosphonic acid | | | | | | 0.4 | | | |
| | | Phenylphosphinic acid | | | | | | | 0.4 | | |
| | | Phenyl phosphate | | | | | | | | 0.4 | |
| | Conductive | Solder particle | 60 | 60 | 60 | 60 | 60 | 60 | 60 | 60 | 60 |

TABLE 1-continued

|  |  | Example 1 | Example 2 | Example 3 | Example 4 | Example 5 | Example 6 | Example 7 | Example 8 | Example 9 |
|---|---|---|---|---|---|---|---|---|---|---|
|  | particle Sn42Bi58 |  |  |  |  |  |  |  |  |  |
| Type of conductive material |  | Paste | Paste | Paste | Paste | Paste | Paste | Paste | Paste | Paste |
| Viscosity of conductive material at 25° C. (Pa · s) |  | 80 | 90 | 90 | 80 | 90 | 100 | 100 | 90 | 100 |
| Presence (P)/absence (A) of pressurization during heating of conductive material layer |  | A | A | A | A | A | A | A | A | A |
| Evaluation | (1) Moist heat resistance | ○ | ○ | ○ | ○ | ○ | ○ | ○ | ○ | ○ |
|  | (2) Placement accuracy (condition A) | ○○ | ○ | ○ | ○○ | Δ | ○ | ○ | ○ | ○○ |
|  | (2) Placement accuracy (condition B) | ○○ | ○ | ○ | ○○ | Δ | ○ | ○ | ○ | Δ |
|  | (3) Conduction reliability | ○○ | ○ | ○ | ○○ | ○ | ○ | ○ | ○ | ○ |
|  | (4) Insulation reliability (migration) | ○○ | ○○ | ○○ | ○○ | ○○ | ○○ | ○○ | ○○ | ○○ |
|  | (5) Void | ○ | ○ | ○ | ○ | ○ | ○ | ○ | ○ | ○ |

TABLE 2

|  |  |  | Comparative Example 1 | Comparative Example 2 | Comparative Example 3 | Comparative Example 4 |
|---|---|---|---|---|---|---|
| Compounded component (part(s) by weight) | Thermosetting compound | EP-3300 | 10.2 | 20 | 10.7 | 22.2 |
|  |  | YDF-8170C | 10.2 | 20 | 10.7 |  |
|  | Thermosetting agent | HN-5500 |  |  |  |  |
|  |  | RIKACID TH | 19.6 |  |  |  |
|  |  | MEH-8000H |  |  | 18.6 |  |
|  |  | TMMP |  |  |  | 17.8 |
|  | Organophosphorus compound | Hishicolin PX-4MP |  | 0.4 | 0.4 | 0.4 |
|  |  | Hishicolin PX-4FB |  |  |  |  |
|  |  | Hishicolin PX-4B |  |  |  |  |
|  |  | Hishicolin PX-4ET |  |  |  |  |
|  |  | Hishicolin PX-4PB |  |  |  |  |
|  |  | Phenylphosphonic acid |  |  |  |  |
|  |  | Phenylphosphinic acid |  |  |  |  |
|  |  | Phenyl phosphate |  |  |  |  |
|  | Conductive particle | Solder particle Sn42Bi58 | 60 | 60 | 60 | 60 |
| Type of conductive material |  |  | Paste | Paste | Paste | Paste |
| Viscosity of conductive material at 25° C. (Pa · s) |  |  | 90 | 60 | 60 | 60 |
| Presence (P)/absence (A) of pressurization during heating of conductive material layer |  |  | A | A | A | A |
| Evaluation | (1) Moist heat resistance |  | ○ | × | Δ | × |
|  | (2) Placement accuracy (condition A) |  | × | × | × | ○○ |
|  | (2) Placement accuracy (condition B) |  | × | × | × | ○ |
|  | (3) Conduction reliability |  | × | × | × | ○○ |
|  | (4) Insulation reliability (migration) |  | × | × | × | × |
|  | (5) Void |  | Δ | × | × | × |

The same tendency was observed even when using a flexible printed board, a resin film, a flexible flat cable and a rigid flexible substrate.

EXPLANATION OF SYMBOLS 1, 1X: Connection structure
2: First connection object member
2a: First electrode
3: Second connection object member
3a: Second electrode
4, 4X: Connection portion
4A, 4XA: Solder portion
4B, 4XB: Cured product portion
11: Conductive material
11A: Solder particles (conductive particles)
11B: Thermosetting component

The invention claimed is:

1. A conductive material comprising a plurality of conductive particles in which an outer surface portion of a conductive portion comprises solder, a thermosetting compound, an acid anhydride thermosetting agent, and an organophosphorus compound; and
the organophosphorus compound containing an organophosphonium salt.

2. The conductive material according to claim 1, wherein the melting point of the organophosphorus compound is 170° C. or less.

3. The conductive material according to claim 1, wherein the organophosphorus compound is in a liquid state at 25° C.

4. The conductive material according to claim 1, wherein the acid anhydride thermosetting agent is a solid at 25° C.

5. The conductive material according to claim 1, wherein a content of the organophosphorus compound is 0.5 parts by weight or more and 10 parts by weight or less with respect to 100 parts by weight of the acid anhydride thermosetting agent.

6. The conductive material according to claim 1, wherein a content of the acid anhydride thermosetting agent in 100% by weight of the conductive material is 5% by weight or more and 50% by weight or less.

7. The conductive material according to claim 1, which is a conductive paste.

8. A connection structure comprising:
- a first connection object member having at least one first electrode on its surface;
- a second connection object member having at least one second electrode on its surface; and
- a connection portion connecting the first connection object member and the second connection object member,
- the connection portion including the conductive material according to claim 1, and
- the first electrode and the second electrode being electrically connected by a solder portion in the connection portion.

9. The connection structure according to claim 8, wherein, when viewing a portion where the first electrode and the second electrode face each other in a stacking direction of the first electrode, the connection portion, and the second electrode, the solder portion in the connection portion is placed in 50% or more of 100% of the area of the portion where the first electrode and the second electrode face each other.

10. A method for producing a connection structure, comprising:

- placing the conductive material according to claim 1 on a surface of a first connection object member, having at least one first electrode on its surface, with the use of the conductive material;
- disposing a second connection object member, having at least one second electrode on its surface, on a surface opposite to the first connection object member side of the conductive material such that the first electrode and the second electrode face each other; and
- heating the conductive material to a temperature not less than a melting point of solder of the conductive particles to form a connection portion, connecting the first connection object member and the second connection object member, with the conductive material and electrically connecting the first electrode and the second electrode via a solder portion in the connection portion.

11. The method for producing a connection structure according to claim 10, wherein, when viewing a portion where the first electrode and the second electrode face each other in a stacking direction of the first electrode, the connection portion, and the second electrode, the solder portion in the connection portion is placed in 50% or more of 100% of the area of the portion where the first electrode and the second electrode face each other.

* * * * *